United States Patent [19]

Joder et al.

[11] Patent Number: 4,864,223
[45] Date of Patent: Sep. 5, 1989

[54] MEASURING TRANSFORMER TO MEASURE THE CURRENT FLOWING IN AN ELECTRIC CONDUCTOR

[75] Inventors: Andreas Joder, Unterageri; Mathis Halder, Baar; Thomas Seitz, Zug, all of Switzerland

[73] Assignee: LGZ Landis & Gyr Zug AG, Zug, Switzerland

[21] Appl. No.: 195,081

[22] Filed: May 17, 1988

[30] Foreign Application Priority Data

May 26, 1987 [CH] Switzerland ............... 02026/87

[51] Int. Cl.$^4$ ............... G01R 1/20; G01R 33/00; G01R 19/00
[52] U.S. Cl. ............... 324/117 H; 324/127; 324/251
[58] Field of Search ............... 324/127, 117 H, 117 R, 324/251; 307/309

[56] References Cited

U.S. PATENT DOCUMENTS

| | | | |
|---|---|---|---|
| 2,924,775 | 2/1960 | Neugebauer | 324/117 H |
| 3,323,056 | 5/1967 | Haley | 324/127 |
| 4,742,296 | 5/1988 | Petr et al. | |
| 4,749,939 | 6/1988 | Seitz | 324/127 |

FOREIGN PATENT DOCUMENTS

| | | |
|---|---|---|
| 937993 | 12/1973 | Canada . |
| 0030041 | 6/1981 | European Pat. Off. . |
| 0233988 | 9/1987 | European Pat. Off. . |
| 2322515 | 3/1977 | France . |

OTHER PUBLICATIONS

F. Kuhrt et al., "Hallgeneratoren", Springer-Verlag, pp. 10-11, 114-15, 267-273.
IEEE Trans. on Power Apparatus & Systems, vol. PAS-99, No. 3 May/Jun. 1980, "Hall Effect Measurement of Real and Reactive Power in a Faraday Machines Laboratory", Gary Johnson.

Primary Examiner—Ernest F. Karlsen
Attorney, Agent, or Firm—Marmorek, Guttman & Rubenstein

[57] ABSTRACT

A measuring transformer comprises a ferromagnetic core having a central branch. The central branch comprises at least one unit that is surrounded in part by an electrical conductor in the form of a U. Each unit of the central branch of the core has two outer air gaps and one or more central air gaps. Each outer air gap has length, that when measured in the longitudinal direction of the unit, is longer than the sum of the lengths of the one or more central air gaps. At least one magnetic sensor is contained in a central air gap of each unit and the central branch includes a total of at least two magnetic sensors. The measuring transformer is especially well suited for use in multifunction measuring instruments.

9 Claims, 4 Drawing Sheets

MEASURING TRANSFORMER TO MEASURE THE CURRENT FLOWING IN AN ELECTRIC CONDUCTOR

FIELD OF THE INVENTION

The present invention relates to a measuring transformer to measure the current flowing in an electric conductor.

BACKGROUND OF THE INVENTION

Measuring transformers of this type are used to advantage in multi-functional measuring instruments such as for instance in electricity meters or wattmeters which measure two types of energy or performance simultaneously. They can also be used to measure a current in combination with another quantity or to measure a squared current and its time integral. In all instances the momentary value of an electric current is measured with the measuring transformer and is then multiplied by the momentary value of a voltage. Such a multiplication is preferably carried out with the help of a Hall element which, in its capacity as magnetic field sensor, serves to measure a magnetic induction produced by the current and thus to measure the current.

A measuring transformer used to measure the current flowing in an electric conductor is disclosed in "Hall Generators, Properties and Applications", by F. Kurth and H. J. Lippman, Springer Verlag, 1968, pages 10 to 11 and pages 267 to 275.

It is the object of the present invention to create a measuring transformer for measuring the current flowing in an electric conductor while avoiding the normally high expenditure incurred for several separate ferromagnetic cores, said measuring transformer being especially well suited for integration into a multi-functional measuring instrument or into other measuring instruments requiring at least two magnetic field sensors and evaluating at least one current value.

SUMMARY OF THE INVENTION

The present invention is a measuring transformer which comprises a ferromagnetic core having a central branch. The central branch comprises one or more units surrounded in part by an electrical conductor in the form of a U. Each unit of the central branch of the core has two outer air gaps and one or more central air gaps. The length of each outer air gap, when measured in the longitudinal direction of the unit, is longer than the sum of the lengths of the one or more central air gaps. At least one magnetic sensor is contained in a central air gap of each unit and the central branch includes a total of at least two magnetic sensors.

The measuring transformer of the present invention is especially well suited for use in multi-function measuring instruments. When the measuring transformer of the present invention is used in a multi-function measuring instrument, only a single core structure is utilized instead of a separate core for each function.

BRIEF DESCRIPTION OF THE DRAWINGS

Identical reference numbers designate the same elements in all figures of the drawing.

DETAILED DESCRIPTION OF THE INVENTION

Figure 1:
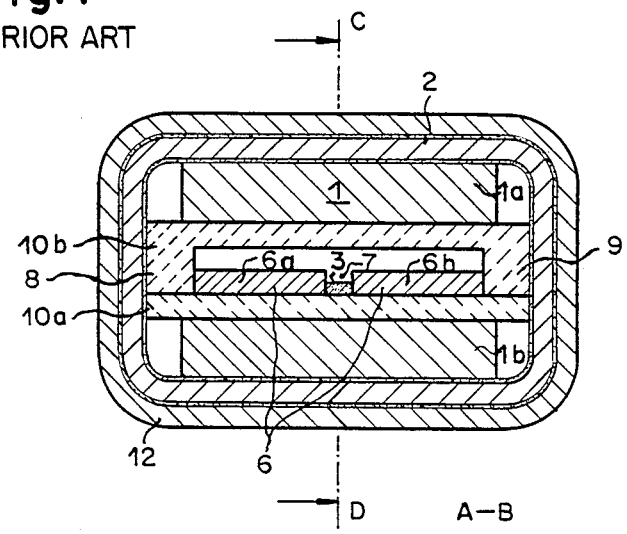
FIG. 1 shows a first cross-section A-B of the construction of a measuring transformer usable in a single-function measuring instrument.
Figure 2:
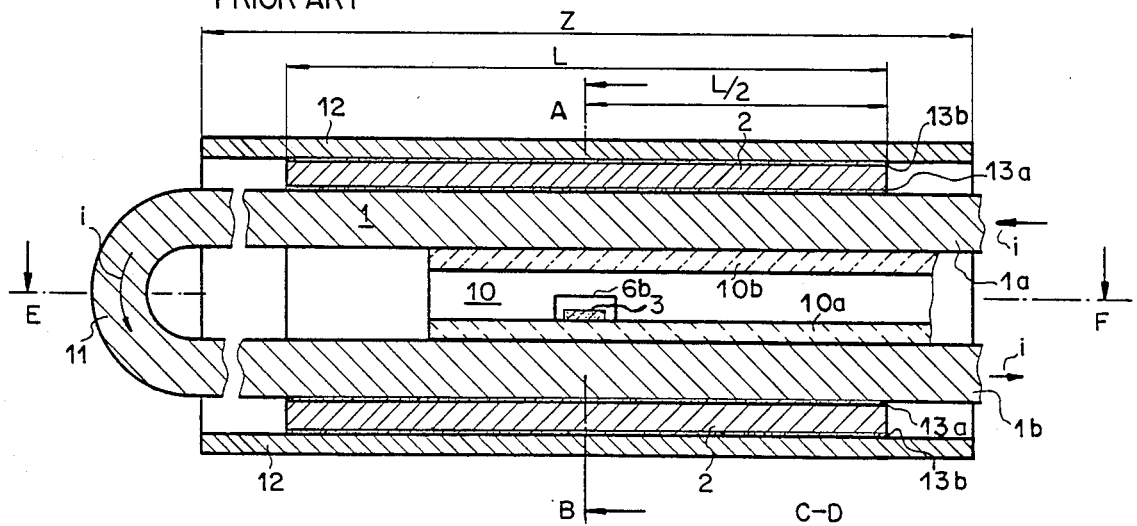
FIG. 2 shows a second cross-section C-D of the construction of the measuring transformer shown in FIG. 1.
Figure 3:
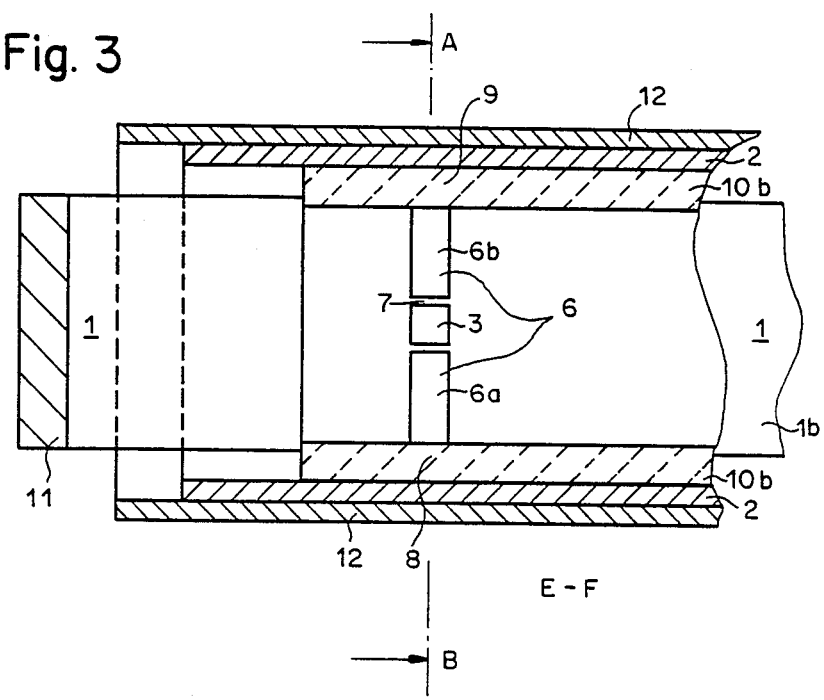
FIG. 3 shows a schematic third cross-section E-F of the construction of the measuring transformer shown in FIG. 1.

The measuring transformer shown in FIGS. 1 to 3 to measure the current i flowing in an electric conductor 1 contains a three-branch ferromagnetic core 2; 6 and a magnetic field sensor 3, preferably in form of a Hall element. The ferromagnetic core 2; 6 preferably comprises a ring 2 and a central branch. The upper and lower surfaces of ring 2, as shown in the illustration, constitute the two outer branches and the two lateral surfaces of ring 2 constitute the yoke of the three-branch ferromagnetic core 2; 6, whereby the yoke connects each of the three branches at their two ends with each other. Iron-nickel alloys such as for example Permenorm, Vacoperm, Trafoperm, Permax, Ultraperm or Mumetall are suitable materials for the ferromagnetic core 2; 6 because of their high permeability.

The central branch 6 has at least three air gaps 7, 8 and 9, of which the middle air gap 7 contains the magnetic field sensor 3 while the two outer air gaps 8 and 9 are located respectively at the two ends of the central branch 6. The length of the middle air gap 7, measured in the longitudinal direction of the central branch 6, is nearly equal to the width of the magnetic field sensor 3 measured in the same direction, so that it is defined exactly by that width of the magnetic field sensor 3. (The longitudinal direction of the central branch extends parallel to the two arrows drawn in FIG. 1). Both the two outer air gaps 8 and 9 are preferably longer than the middle air gap 7, when measured in the longitudinal direction of central branch 6. The central branch 6 preferably comprises two flat sheet metal strips 6a and 6b which are located, together with the magnetic field sensor 3, in a housing 10 made of non-ferromagnetic material, preferably ceramic. Housing 10 is preferably provided with a bottom 10a and with a housing cover 10b. The central branch 6 and the magnetic field sensor 3 are preferably located on a bearing device made of insulation material on which electronic components can, for example, also be present, whereby the bottom 10a of housing 10 preferably constitutes this bearing device. This makes it possible to assemble the magnetic field sensor 3 and the central branch 6 which together constitute one building unit simply, precisely and reliably, whereby these two components can thus be produced using a technology different from that used to produce the remaining elements of the ferromagnetic core 2; 6. The two outer air gaps 8 and 9 are each filled by a wall of housing 10 so that their air gap lengths can be defined precisely by the wall thickness of housing 10. Ring 2 comprises at least one piece of sheet metal curved in the form of a ring, thus simplifying its manufacture considerably. The length L of ring 2 (see FIG. 2) is greater than its greatest opening so that it screens the magnetic field sensor 3 very effectively against the effects of external and extraneous magnetic fields $H_a$. The electric conductor 1 has preferably a rectangular cross-section and ring 2 is then also preferably rectangular. The central branch 6 is surrounded at least in part by the electric conductor 1 and is preferably located between go-and-return conductors 1a and 1b of the electric conductor 1 running parallel to each other in proximity of each other. The electric conductor 1 constitutes for example a U-shaped loop 1 (see FIG. 2). The go-and-return conductors 1a and 1b of the electric conductor 1 run parallel to each other. The rectangular cross-section of the electric conductor 1 could for example measure 2 mm × 10 mm for a current i of 100A. If a Hall element for example is used as the magnetic field sensor 3 to measure magnetic fields which are effective perpendicular to its surface, the magnetic field sensor 3 may completely fill air gap 7. If, on the other hand, a Hall element is used which measures the magnetic fields taking effect parallel to its surface, the magnetic field sensor 3 fills out for instance only the lower half (see FIG. 1) of the air gap 7. The length of the air gap 7 can measure for example 0.6 mm, and that of the additional air gaps 8 and 9 each 1.7, for instance. Furthermore, inside or outside the housing 10a; 10b, additional electronic building elements (not shown) can be also installed on the bearing device, these building elements being for example components of the electronic circuitry of the magnetic field sensor 3.

It was assumed in FIG. 1 that the width of the housing 10 is greater than the width of the electric conductor 1. In this case the housing 10 fills, for example in the cross-section A-B of FIG 1, the space between the go-and-return conductors 1a and 1b of loop 11 completely. The width of housing 10 can also be equal to or smaller than the width of the electric conductor 1. In the latter case housing 10 fills the space between the go-and-return conductors 1a and 1b only partly in the cross-section A-B. In all cases the ring 2 of the length L surrounds the go-and-return conductors 1a and 1b of loop 1 as well as the housing 10 in such manner that the central branch 6 is located nearly in the middle, at half distance L/2 from the edge of ring 2 (see FIG. 2). The go-and-return conductors 1a and 1b of loop 11 traverse the hollow space between housing 10 and ring 2 e.g. in such manner that they have as much as possible spatial contact with housing 10a; 10b as well as electrically insulated spacial contact with ring 2. Thus an insulation layer 13a exists between ring 2 on the one hand and the go-and-return conductors 1a and 1b of loop 11 on the other hand (FIG. 2).

Ring 2 is preferably completely surrounded on its outer surface by a nearly parallel, ring-shaped and longer outer shield 12. Between ring 2 and the outer shield 12 an insulation layer 13b is provided. The outer shield 12 has a length Z which is greater than the length L of ring 2 so that the latter's frontal surfaces are also partly shielded. The length Z can measure for example 30 mm. The outer shield 12 is preferably made of deep-drawing steel or of an iron-nickel alloy. The insulation layer 13b between ring 2 and the outer shield 12 serves here also to increase the spacial distance between the two, and this improves the shielding effect of the outer shield 12. This spacial distance can measure for example 0.05 mm. It is the role of the outer shield 12 to relieve the highly permeable but easily saturated ring 2, which in fact also acts as a shield, when strong external and extraneous magnetic fields Ha occur. Without an outer shield 12 the screen formed by ring 2 remains unsaturated up to a value of the external and extraneous magnetic field $H_a$ of approximately 50A/cm. When the double shield is present however, the shield formed by ring 2 remains unsaturated up to a value of the external and extraneous magnetic field $H_a$ of approximately 200A/cm.

When an iron-nickel alloy is used for core 2; 6 density changes of the magnetic field lines within the ferromagnetic material are negligible in comparison with that at the air gap 7 or at the air gaps 7, 8 and 9. Correspondingly, non-linearity, a phase error and a temperature coefficient of the highly permeable material have only a minimal effect upon the measuring transformer. The arrangement of the central branch 6 and of the magnetic field sensor on a bearing device and/or in a housing 10 allows for an especially precise, simple and reliable assembly of the measuring transformer. The utilization of three air gaps 7, 8 and 9 makes it possible to concentrate all tolerance problems of the air gap lengths in the two outer air gaps 8 and 9 where they cause the least amount of interference, since the magnetic field lines are no longer parallel and tightly packed at that location but already begin to disperse and see their passage through the air gap adjoining the ferromagnetic core 2. These tolerance problems decrease as dispersion of the magnetic field lines increases, i.e. the longer the outer air gaps 8 and 9 are.

The measuring transformer for a one-function measuring instrument as shown in FIGS. 1 to 3 is provided with central branch 6 of the three-branch ferromagnetic core 2; 6 which comprises a single unit 8; 6a; 7; 6b; 9. This unit 8; 6a; 7; 6b; 9 has two sheet-metal strips 6a and 6b as well as three air gaps 7, 8 and 9, with one single magnetic field sensor 3 being provided in the central air gap 7.

If such a measuring transformer is to be used in a multifunction measuring instrument, a total of at least two magnetic field sensors are required in the central branch 6. The latter then comprises at least one unit, whereby each unit has at least three air gaps, all of which with the exception of the two outermost air gaps 8 and 9 of each unit containing each at least one magnetic field sensor. As an example the presence of three magnetic field sensors 3, 3a and 3b has been assumed in FIGS. 4 and 5 and the presence of two magnetic field sensors 3 and 3a has been assumed in FIG. 6.

Figure 4:
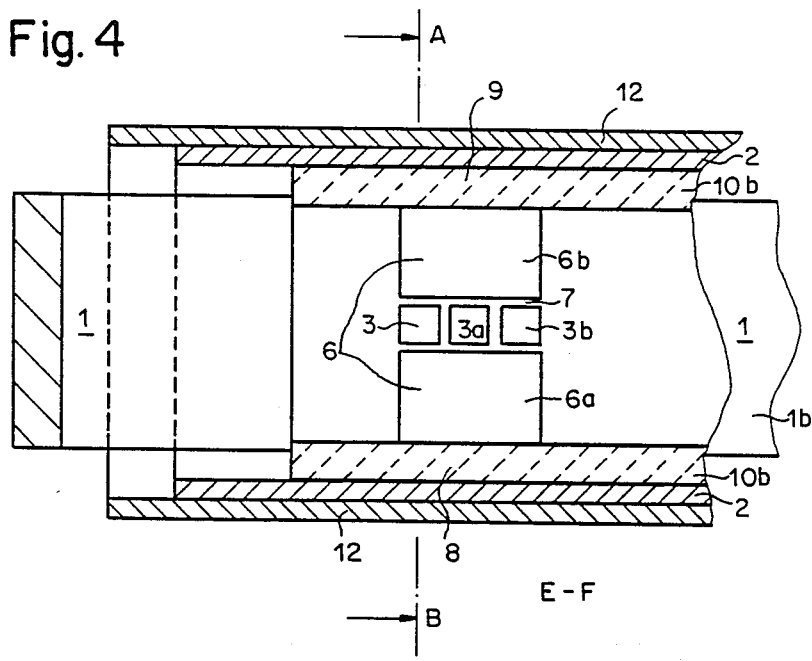
FIG. 4 shows a schematic cross-section E-F of the construction of a first variant of the measuring transformer according to the invention.

FIG. 4 represents a first embodiment of the measuring comprising one single unit 8; 6a; 7; 6b; 9 having three air gaps 7, 8 and 9. FIG. 4 is different from FIG. 3 in that the width of the single unit 8; 6a; 7; 6b; 9 of the central branch 6, i.e. the width of the sheet-metal strips 6a and 6b has been selected so that all of the required magnetic field sensors 3, 3a and 3b can be installed parallel next to each other in the corresponding central air ga 7. Each of the thus adjoiningly installed magnetic field sensors 3, 3a and 3b measures the same current i which flows in the electric conductor 1.

Figure 5:
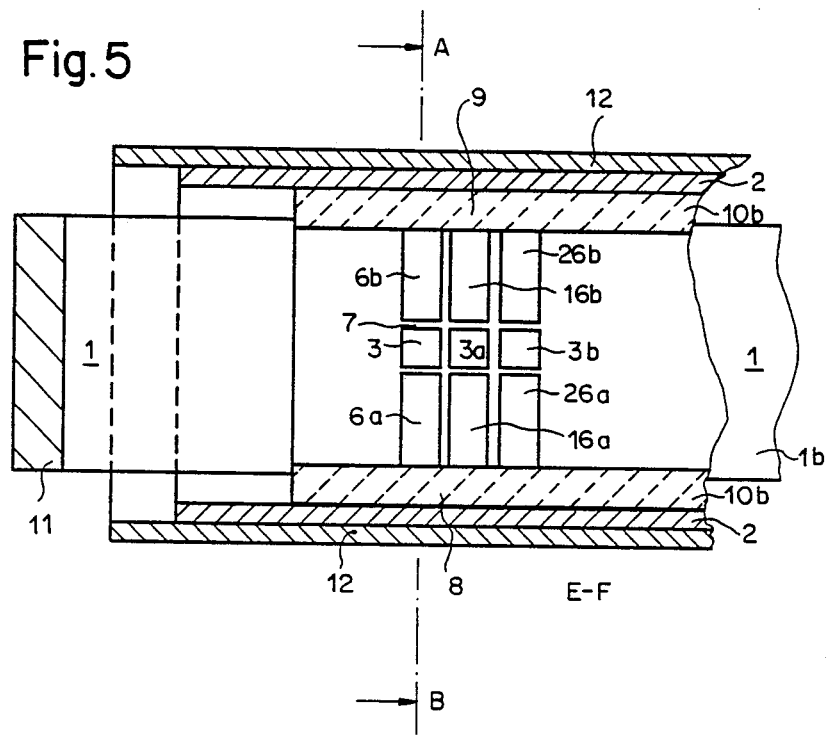
FIG. 5 shows a schematic cross-section E-F of the construction of a second variant of the measuring transformer according to the invention.

FIG. 5 shows a second illustrative embodiment of the measuring transformer according to invention. FIG. 5 is different from FIG. 3 in that the central branch 6 comprises in this example three parallel units separate from each other, i.e. of one first unit 8; 6a; 7; 6b; 9, a second unit 8; 16a; 7; 16b; 9 and a third unit 8; 26a; 7; 26b; 9. All three units are preferably of identical construction and identical size. This means that each of the three units comprise at least two sheet-metal strips 6a and 6b or 16a and 16b or 26a and 26b as well as of at least three air gaps 7, 8 and 9. At least one magnetic field sensor 3 or 3a or 3b is installed in the central air gap 7 of each unit. Here too, each magnetic field sensor 3, 3a and 3b measures the same current i flowing in the electric conductor 1. In practice two units 8; 6a; 7; 6b; 9 and 8; 16a; 7; 16b; 9 are always present in the second illustrative embodiment.

Figure 6:
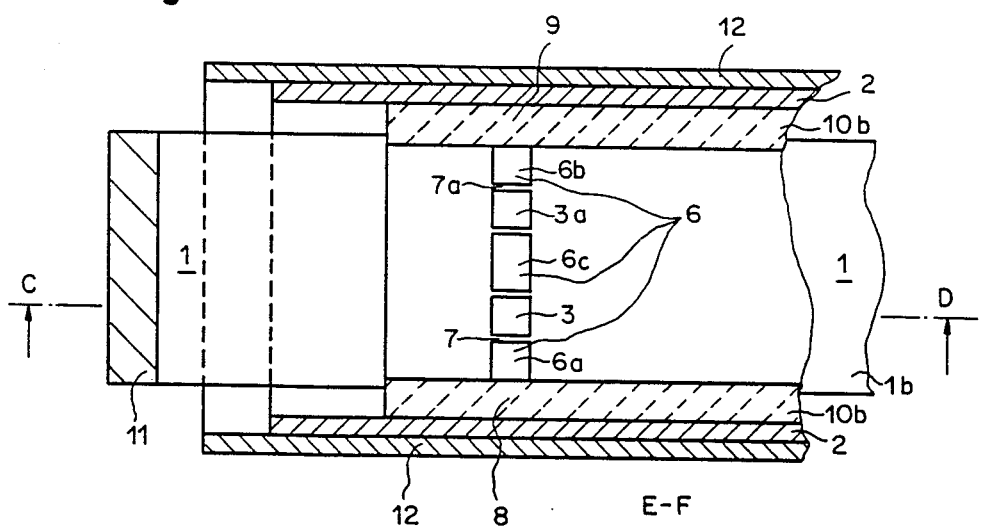
FIG. 6 shows a schematic cross-section E-F of the construction of a third variant of the measuring transformer according to the invention and FIG. 7 shows a modular display of a multi-functional measuring instrument.

FIG. 6 shows a third embodiment of the measuring transformer according to the invention, with the central branch 6 comprising one single unit 8; 6a; 7; 6c; 7a; 6b; 9. FIG. 6 is different from FIG. 3 in that the length of the single unit 8; 6a; 7; 6c; 7a; 6b; 9 of the central branch 6 is sufficiently long so that all the required magnetic field sensors, i.e. at least two magnetic field sensors 3 and 3a can be installed in the longitudinal direction of the central branch 6, parallel one behind the other, whereby an additional sheet metal strip 6c (see FIG. 6) can optionally and advantageously be installed between two adjoining magnetic field sensors 3 and 3a in extension to the sheet metal strips 6a and 6b. All of the sheet metal strips 6a, 6b and 6c are preferably of identical cross-section. Without the presence of such an additional sheet metal strip 6c the single unit 8; 6a; 7; 7a; 6b; 9 of the central branch 6 is provided with at least three air gaps 8, 9 and 7; 7a, whereby several magnetic field sensors 3 and 3a are located in the central air gap 7; 7a. When at least one additional sheet-metal strip 6c (see FIG. 6) is present, unit 8; 6a; 7; 6c; 7a; 6b; 9 has at least four air gaps 7, 7a 8 and 9, whereby one magnetic field sensor 3 or 3a is installed in each of the central air gaps 7 and 7a. The magnetic field sensor 3 can for instance be located in the air gap 7 and the magnetic field sensor 3a in the air gap 7a. The two air gaps 7 and 7a are separated from each other by the optionally provided third sheet-metal strip 6c. Here too, all the magnetic field sensors 3 and 3a measure the same current i flowing in the electric conductor 1.

Illustratively, for all three embodiments of the measuring transformer according to the invention, the condition applies that each of the two outer air gaps 8 and 9 of each unit, measured in the longitudinal direction of the central branch 6, be longer than the sum of the lengths of all the other air gaps 7 and 7a of the same unit. The central branch 6 and all the required magnetic field sensors 3, 3a and 3b together preferably constitute one single assembly. The central branch 6, all the sheet metal strips 6a, 6b and 6c as well as all the magnetic field sensors 3, 3a and b are preferably installed in the single housing 10 on a bearing device made of insulating material.

The current flowing in conductor 1 produces a magnetic induction B which is measured by all the magnetic field sensors 3, 3a and 3b, so that the measured value of magnetic induction and thereby also the measured value of the current occurs at the output of each of the magnetic field sensors 3, 3a and 3b in form of an electric voltage u1, even though only one single ferromagnetic core 2;6 is present in each. A multi-functional measuring instruments can thus be put together economically when using such a measuring transformer since one core per desired function is no longer required, but only one single core for all the functions together.

Figure 7:
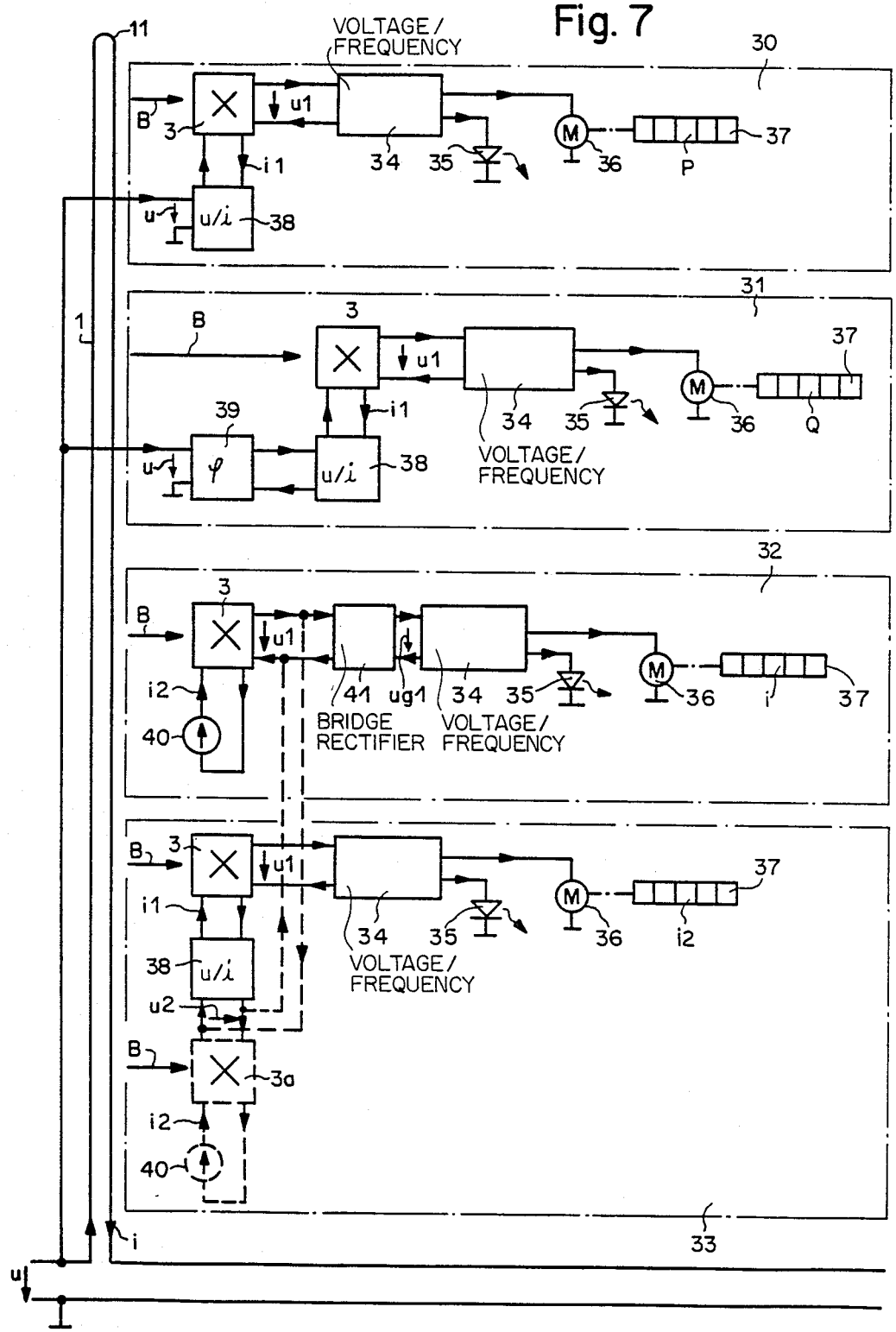

The schematic diagram of FIG. 7 shows four single-function measuring instruments 30, 31, 32 and 33. The first measuring instrument 30 is an active energy or active output measuring instrument, e.g. a known electricity meter. The second measuring instrument 31 is a wattless energy or wattless power measuring instrument, the third measuring instrument 32 is a current measuring instrument and the fourth measuring instrument 33 is a squared current measuring instrument.

The single-function measuring instruments 30, 31 and 33 are put together similarly and all have a magnetic field sensor 3, the magnetic field sensor's two-pole output being led to a two-pole input of a voltage-frequency transformer 34, whereby a first output of the latter is connected to a luminous diode 35 and a second output is connected to a first feeder pole of a stepper motor 36. The second feeder pole of the stepper motor 3 and the cathode of the luminous diode 35 are both grounded in this case, while the stepper motor mechanically drives a measured-value display 37. The presence of a five-figure number indication is assumed in FIG. 7. Instead of an electro-mechanical device 36; 37 for the evaluation of the measured value it is of course also possible to utilize a purely electronic display: in that case the stepping motor 36 is omitted.

The measuring instrument 32 has therefore the same basic equipment as the measuring instruments 30, 31 and 33. To be able to measure also pure alternate currents i (median value=0) by means of measuring instrument 32, a bridge rectifier 41 must be inserted on line between the magnetic field sensor 3 and the voltage/frequency transformer 34. The bridge rectifier 41 transforms the output voltage u1 of the magnetic field sensor 3 into a proportional direct current u1 and this can then be led to the voltage/frequency transformer 34.

In all measuring instruments 30 to 33 the voltage/frequency transformer 34 changes the output voltage of the corresponding magnetic field sensor 3, e.g. u1 of the bridge rectifier 41, into a proportional frequency of an output signal of the voltage/frequency transformer 34 that comprises rectangular pulses. This output signal appears at both outputs of the voltage/frequency transformer 34. The luminous diode 35 blinks with the rhythm of the output frequency of the corresponding voltage/frequency transformer 34 and serves as an optical output of each corresponding measuring instrument. The value of its blinking frequency is a measure for the value of the output voltage u1 of the corresponding magnetic field sensor 3 or ug1 of the bridge rectifier 41 and can be evaluated by means of a known measuring device (not shown). A second display which can be read directly with the naked eye shows the integrated value of the output frequency and thereby the integrated value of the output voltage u1 or ug1 by means of the stepper motor 36 and the display 37. Depending upon whether the output pulses of the voltage/frequency transformer 34 are integrated, i.e. counted over the time unit or over a predetermined measuring period, display 37 will show the measured value of a power or of an energy.

Measuring instrument 30 always measures an active output or an active energy while the measuring instrument 31 measures an idle or wattless power, measuring instrument 32 measures the current i or a product i×h and measuring instrument 33 measures a squared current $i^2$ or a product $i^2 \times h$, where h is the number of hours over which integration takes place.

In the drawing of FIG. 7 all the magnetic field sensors 3 are under the influence of the same magnetic induction B which is produced by the same current i. The current i flows through the conductor 1 which is preferably curved in the shape of U and which surrounds at least partly all the magnetic field sensors 3. This U-shaped conductor 1 is only shown schematically in FIG. 7. The voltage of current i, e.g. the supply voltage is designated with the letter u and is grounded at one pole.

In addition, the first measuring instrument 30 is equipped with a voltage/current transformer 38 the input of which is fed by the voltage u. The voltage/current transformer 38 transforms voltage u into a proportional current i1 which supplies the Hall element of the magnetic field sensor 3. Since the magnetic field sensor 3 is exposed to the magnetic induction B which is proportional to current i, the output voltage u1 of the magnetic field sensor is known to be in proportion to the product i×u and the measured output value of the measuring instrument 3 is then equal to the active output or active energy.

The construction of the second measuring instrument 31 is similar to that of the first measuring instrument 30, with the difference that a phase shifter 39, e.g. a 90° phase shifter is connected before the voltage/current transformer 38, the phase shifter's input being supplied this time from the voltage u, while the output of the phase advancer 39 is connected by two poles with the input of the voltage/current transformer 38 If current i and voltage u are alternating quantities, and if a 90° phase shifter is used, the second measuring instrument 31 is known to measure this time the wattless power or wattless energy.

The third measuring instrument 32 is, in addition to the basic equipment, also equipped with a constant current source 40 and with a bridge rectifier 41. The constant current source 40 supplies the Hall element of the magnetic field sensor 3 directly with a constant current i2. The output voltage u1 of the magnetic field sensor 3 is converted by means of the bridge rectifier 41 into the proportional direct current ug1. The output voltage u1 of the magnetic field sensor 3 and the direct voltage ug1 are then proportional to the magnetic induction B and thereby also proportional to the current, e.g. current i to be measured. The third measuring instrument 32 thus measures either current i or the product i×h.

The fourth measuring instrument 33 is, in addition to the basic equipment, equipped with a second magnetic field sensor 3a, with a voltage/current transformer 38 and with a constant current source 40. The constant current source 40 then supplies the hall element of the second magnetic field sensor 3a with a constant current i2, so that an output voltage u2 of the second magnetic field sensor 3a, which is also subjected to the magnetic induction B, is proportional to the current i. The voltage u2 supplies the input of the voltage/current transformer 38, the output current i1 of which supplies the Hall element of the first magnetic field sensor 3 and is itself proportional to current i. The Hall element of the first magnetic field sensor 3 is supplied through current i1 and is subjected to the magnetic induction B, whereby B as well as i1 are proportional to i, so that the output voltage u1 of the magnetic field sensor 3 is proportional to $i^2$. The fourth measuring instrument 33 thus measures the squared current $i^2$ or the product $i^2 \times h$.

A multi-function measuring instrument contains at least two of the single-function measuring instruments 30 to 33 shown in FIG. 7. If a measuring instrument 32 as well as a measuring instrument 33 is present in such a multi-function measuring instrument the constant current source 40 and the second magnetic field sensor 3a can be dispensed with and in their stead the constant current source 40 and the magnetic field sensor 3 of the measuring instrument 32 can be jointly used. In this case the two-pole connection, shown in broken lines in FIG. 7, between the measuring instrument 32 and the measuring 33 or, stated more concretely, between the output of the magnetic field sensor 3 of the measuring instrument 32 and the input of the voltage/current transformer 38 of measuring instrument 33 is required. The building elements 3a and 40 shown in the measuring instrument 33 in form of broken lines are then superfluous and can be omitted.

However, even if only one measuring instrument 33 is present, the measuring transformer according to the invention can be used, as the measuring instrument 33 in itself already requires as a rule two magnetic field sensors 3 and 3a.

The measuring instrument 33 and the measuring instrument combinations 30, 31; 30, 32; 30, 33; 31, 32; 31, 33; 32, 33; 30, 31, 32; 30, 31, 33; 30, 32, 33; 31, 32, 33 and 30, 31, 32, 33 represent an inexhaustible list of possible instruments in which a measuring transformer according to the invention can be used.

It is a great advantage of the measuring instrument 33 and of all the above-mentioned combinations of measuring instruments that all of them now only require one single core 2; 6, the central branch 6 of which is formed so that all the required magnetic field sensors 3, 3a and 3b can find room in its air gaps 7 and 7a so that they all measure the same current i via magnetic induction B.

Finally, the above-described embodiments of the invention are intended to be illustrative only. Numerous alternative embodiments may be devised by those skilled in the art without departing from the spirit and scope of the following claims.

We claim:

1. A measuring sensor for measuring an electric current flowing in an electric conductor comprising:
   a ferromagnetic core comprising a central branch and two outer branches,
   said central branch being surrounded at least in part by said electric conductor, said central branch comprising one or more units,
   each unit comprising at least first and second sections of ferromagnetic material aligned along a single longitudinal axis and defining at least three spaces which are not filled with ferromagnetic material, two of said spaces being outer spaces located at the ends of said central branch along said longitudinal axis and a third of said spaces being an inner space located between said first and second ferromagnetic sections and containing at least one magnetic sensor, each of said outer spaces being longer in a direction parallel to said longitudinal axis than the sum of the lengths of all inner spaces along said axis,
   said central branch comprising a total of at least two magnetic sensors.

2. The measuring sensor of claim 1 wherein said central branch comprises a single unit defining two outer spaces and a central inner space located between said first and second ferromagnetic sections, all of said magnetic sensors being installed next to each other in said central space.

3. The measuring sensor of claim 1 wherein said central branch comprises a plurality of units arranged parallel to one another, each unit comprising two sections of ferromagnetic material defining two outer spaces and a central inner space containing a magnetic sensor.

4. The measuring sensor of claim 1 wherein said measuring sensor comprises a unit comprising first, second and third sections of ferromagnetic material aligned along a single longitudinal axis so as to define a first inner space located between said first and second sections and a second inner space located between said second and third sections, a magnetic sensor being located in each of said inner spaces.

5. The measuring sensor of claim 1 wherein said central branch and said magnetic sensors are installed in a housing made of non-ferromagnetic material, each of said outer spaces being filled with a wall of said housing.

6. The measuring sensor as in any of claims 1-5 wherein said ferromagnetic core comprises said central branch and a ring-shaped portion which forms said two outer branches.

7. The measuring sensor as in any of claims 1-5 wherein said central branch is located between go and returns conductor portions of said electric conductor, said go and return conductor portions being located in proximity and parallel to each other.

8. The measuring sensor of claim 7 wherein said electric conductor forms a U-shaped loop comprising said go and return conductor portions.

9. The measuring sensor of claim 6 wherein said ring-shaped portion is surrounded by an outer shield.

* * * * *